March 18, 1958 J. R. WHITE 2,827,567
CONTINUOUS PRECISION TUNING SYSTEM
Filed Jan. 24, 1955
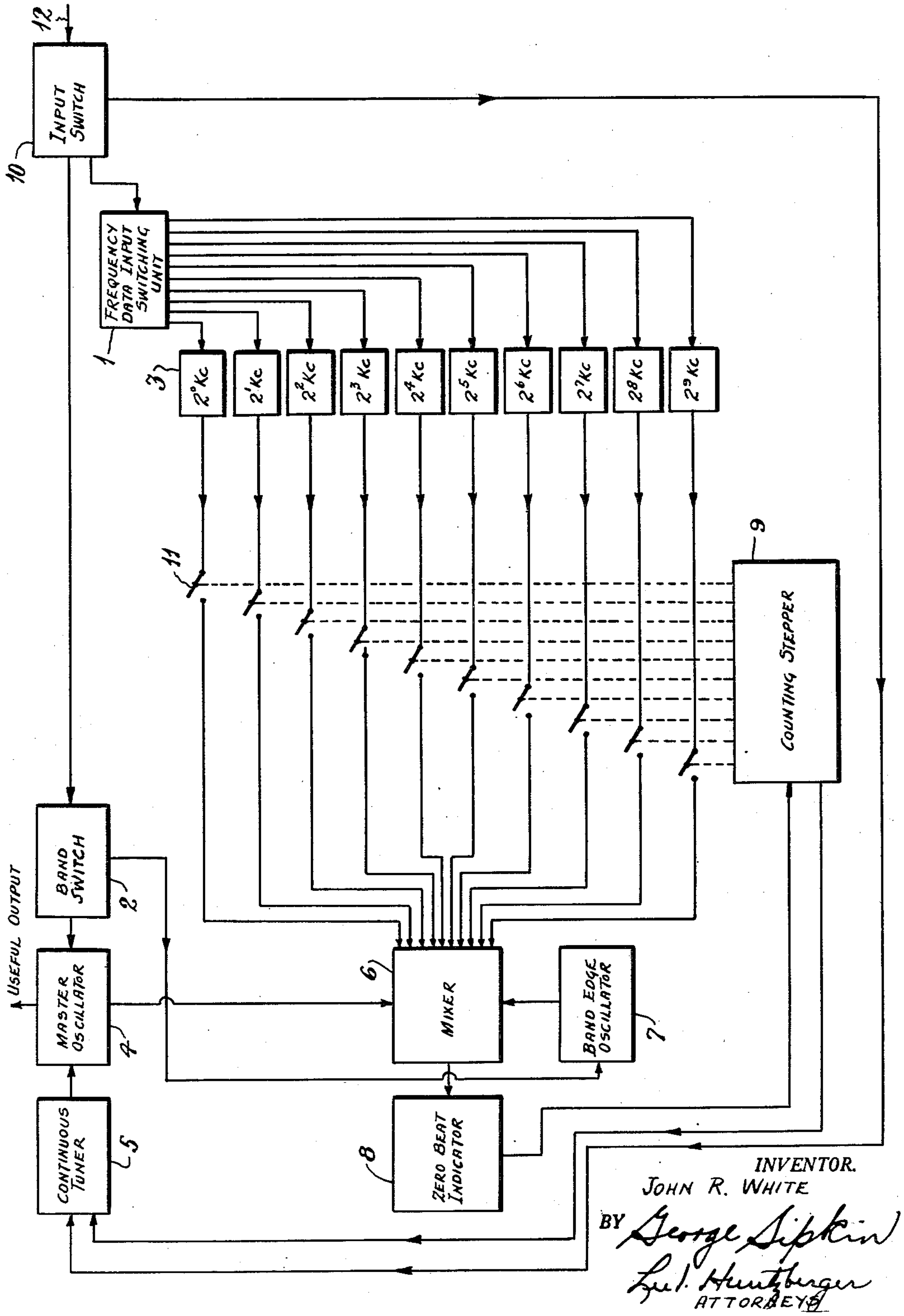
INVENTOR.
JOHN R. WHITE
BY George Sipkin
Leo I. Huntzberger
ATTORNEYS United States Patent Office 2,827,567

Patented Mar. 18, 1958

2,827,567

CONTINUOUS PRECISION TUNING SYSTEM

John R. White, Westbury, N. Y., assignor, by mesne assignments, to the United States of America as represented by the Secretary of the Navy Application January 24, 1955, Serial No. 483,847

1 Claim. (Cl. 250—36)

This invention concerns the continuous precision tuning of an oscillator and a system therefor.

Oscillator tuning methods of the prior art include those wherein related harmonics or nonharmonics are added to the frequencies produced by different crystal oscillators and the undesirable harmonics are filtered out. The filtering out of undesirable harmonics in these methods is extremely difficult and requires many racks of equipment. Frequency adding methods produce results which contain many spurious frequencies.

Other prior art methods include the precision calibration of the oscillator to be tuned. This calibration will drift over a period of time, so that the oscillator has to be recalibrated periodically.

The continuous precision tuning system of the present invention operates in a manner which may be assimilated to an automatic telephone switching system operating in reverse. That is, the oscillator to be tuned is first roughly tuned to a frequency below the lower frequency of its band, and then frequencies are added to said lower band frequency until the exact tuning frequency is reached.

The principal object of this invention is the provision of a system for continuously tuning an oscillator in a precise and rapid manner.

An object of this invention is the provision of a continuous tuning system which tunes an oscillator precisely to any desired frequency, to any desired degree of precision within the practical limitations of the components of the system.

Another object of this invention is the provision of a precision tuning system which tunes an oscillator without producing undesirable spurious frequencies.

A further object of this invention is the provision of a system for the continuous precision tuning of an oscillator in which the tuned frequency of said oscillator does not drift.

Other objects and many of the attendant advantages of this invention will be readily appreciated as the same becomes better understood by reference to the following detailed description when considered in connection with the accompanying drawing wherein the figure is the continuous precision tuning system of the present invention in block diagram form.

The oscillator to be tuned by the system of the figure is the master oscillator 4.

Electrical digital intelligence, containing the ordered tuning frequency data for the oscillator 4, conducted through the electrically conducting input line 12 is received from either a remote source or from a local source. The electrical frequency data intelligence may be transmitted by wireless or by direct wire from a source of intelligence to the input line 12 of the figure. If the electrical intelligence has a local source it may originate at a manually operated keyboard apparatus (not shown in the figure).

In a preferred embodiment of the present invention, illustrated by the figure, an electrical ordered frequency data signal in the form of binary digital intelligence is received in the line 12 either by wire or by radio transmission, or by manual operation of a keyboard which operates binary type lever switches. The received binary intelligence may be in the form of carrier modulation or teletypewriter pulses.

The input switch 10 may be manually closed upon receipt of an input signal in the input line 12 or it may be automatically closed upon the receipt of an input signal. When the input switch 10 is closed it closes the input line 12 to the continuous tuner 5, to the frequency data input switching unit 1 and to the band switch 2.

Upon the closing of the circuit between the input line 12 and the continuous tuner 5, by the input switch 10, the continuous tuner 5 commences the operation of the system by tuning the master oscillator 4 to a frequency below the lower frequency of the preselected band, wherein the frequency, at which the oscillator 4 is to be tuned, lies. The continuous tuner 5 then automatically starts to tune across the band containing the tuning frequency.

A continuous tuner, which may be utilized, is a motor driven condenser which slowly tunes up a preselected band.

Upon the closing of the circuit between the input line 12 and the band switch 2, by the input switch 10, the band switch 2 places the oscillator 4 and the band edge oscillator 7 in the preselected band containing the tuning frequency, due to the energization of the band switch 2 by the input intelligence signal which indicates and identifies the band in which the tuning frequency of the master oscillator 4 is located.

The band switch 2 is not necessary if the frequency to which the master oscillator 4 is desired to be tuned remains in one preselected band and if the band edge oscillator 7 is selected according to such a band. However, if the various tuning frequencies of the oscillator 4 vary widely enough to be located in different preselected bands, the band switch 2 is necessary for proper operational range. The band switch 2 switches different oscillator coils into the circuit of the master oscillator 4 and it switches crystals of different frequencies into the circuit of the band edge oscillator 7 in accordance with the ordered tuning frequency of the oscillator 4 and the preselected band wherein the tuning frequency lies. The band switch 2 thus permits operation over a wide range of tuning frequencies.

Upon the closing of the circuit between the input line 12 and the frequency data input switching unit 1, by the input switch 10, the frequency data input switching unit 1 operates to energize the proper sequence of precision frequency generators 3 in accordance with the ordered tuning frequency for the oscillator 4. The input switching unit 1 energizes a sequence of precision frequency generators 3, ordered by the input intelligence, which produces a total frequency, which when added to the output frequency of the band edge oscillator 7, produces a sum total frequency equal to the ordered tuning frequency of the master oscillator 4. The upper frequency of the band minus the lower frequency of the band must equal the sum of the output frequencies of the precision frequency generators 3, to enable the system to work up from below the lower band frequency to any ordered tuning frequency of the master oscillator 4 in the band.

The input switching unit may be either manually controlled or controlled by received intelligence.

The band switch and input switching circuits of the system are adjusted to be more rapid in operation than the continuous tuner circuit so that the previously described band switching and input switching operations occur before the continuous tuner 5 has progressed up into the band of the tuning frequency.

The precision frequency generators 3 of the figure produce a series of output frequencies which vary in exponential powers of two. The frequency outputs of the precision frequency generators 3, utilized in the system of the figure, are two to the zero power kilocycles, two to the first power kilocycles, two to the second power kilocycles, two to the third power kilocycles, two to the fourth power kilocycles, two to the fifth power kilocycles, two to the sixth power kilocycles, two to the seventh power kilocycles, two to the eighth power kilocycles and two to the ninth power kilocycles. These precision frequencies are respectively equal to 1 kilocycle, 2 kilocylces, 4 kilocycles, 8 kilocycles, 16 kilocycles, 32 kilocycles, 64 kilocycles, 128 kilocycles, 256 kilocycles and 512 kilocycles.

A very fine tuning frequency may be obtained by utilizing precision frequency generators of low frequency outputs. The outputs may be selected in fractions of a kilocycle, such as one half a kilocycle, one fourth of a kilocycle, one eighth of a kilocycle, one sixtheenth of a kilocycle, one thirty second of a kilocycle, one sixty fourth of a kilocycle, one one hundred and twenty eighth of a kilocycle, and so on.

The basic frequency of the band edge oscillator 7 is controlled by the band switch 2 in accordance with the input intelligence on the input line 12. For single band operation there is one crystal in the circuit of the band edge oscillator 7. For multiband operation, there is a crystal in the band edge oscillator circuit for each different band in which the master oscillator is to be tuned. However, the precision frequency generators 3 are rated similarly for all bands, since the purpose of the band edge oscillator 7 is to translate the operation of the precision frequency generators 3 to any range of frequencies in any band desired. This is due to the operation of the band edge oscillator 7 through, or without, the band switch 2 to attain a frequency output equal to the lower frequency of the band in which the tuning frequency of the oscillator 4 is located. The output frequencies of the precision frequency generators 3 then build up upon this lower band frequency until the ordered tuning frequency is reached.

The frequency which the mixer 6 receives from the master oscillator 4 is a frequency below the lower frequency of the band in which the tuning frequency of the master oscillator is located, to which the continuous tuner 5 has brought it. The band edge oscillator 7 feeds the lower frequency of the band to the mixer 6 as does the master oscillator 4. The band edge oscillator 7 indicates when the master oscillator 4 has reached the edge of the band in which its tuning frequency lies.

The master oscillator is an LC oscillator whose frequency is only approximate and whose frequency may drift from time to time. The operation must therefore consist of starting at a reference point, a frequency below the lower band frequency in which the tuning frequency lies, and working up to the tuning frequency each time the tuning operation is performed. Therefore, the master oscillator 4 does not have to be a precision oscillator.

The mixer 6 sends a difference frequency, which is the difference between the frequency fed to it by the master oscillator 4 and the frequency fed to it by the band edge oscillator 7, to the zero beat indicator 8. The zero beat indicator 8 detects when this difference frequency is zero to indicate that the master oscillator 4 and the band edge oscillator 7 are producing identical frequencies, by detecting the difference frequency as it passes through its exact zero point. That is, as the master oscillator 4 passes through the first and through the lowest frequency in the band in which the master oscillator tuning frequency lies, the zero beat indicator recognizes that fact and produces a pulse or beat of current.

The zero beat indicator 8 thus produces a beat or pulse which indicates that the master oscillator 4 is roughly tuned to the first of the digits of the ordered tuning frequency; that is, the master oscillator 4 has reached the basic frequency of the band in which its tuning frequency lies. The zero beat indicator will not recognize the fact that the master oscillator 4 is passing through the lower frequency of its band unless it does pass through said frequency. The zero beat indicator 8 is merely a means for establishing the correspondence between the ordered tuning frequency of the oscillator 4 and the frequency to which the continuous tuner 5 has tuned the oscillator 4 at various intervals in the tuning operation.

The counting stepper 9 is a relay switching unit which is actuated by pulses received from the zero beat indicator 8 to close the appropriate precision frequency generator circuit switches 11. The counting stepper 9 steps itself down in sequence from the precision frequency generator line with the highest frequency output rating to the precision frequency generator line with the lowest frequency output rating.

Upon receipt of an output pulse or beat from the zero beat indicator 8 the counting stepper 9 commences its stepping operation and stops at the highest frequency rated precision frequency generator line which has been energized by the frequency data input switching unit 1. The counting stepper then operates to close the circuit switch 11 in the line at which it has stopped, to connect the output of the highest frequency rated energized precision frequency generator 3 with the mixer 6. The frequency output of the selected precision frequency generator is conducted to the mixer 6, where it is added to the frequency output of the band edge oscillator 7 and the sum frequency is compared with the frequency of the oscillator 4, which is the frequency to which the continuous tuner 5 has tuned the oscillator 4 at such time. The zero beat indicator 8 then produces a pulse or beat which is conducted to the counting stepper 9 to continue the stepping operation and which indicates that the continuous tuner 5 has turned the oscillator 4 to a frequency which is the sum of the lower frequency of the tuning frequency band and the output of the highest rated energized precision frequency generator.

When the beat, representing that the continuous tuner 5 has already tuned the oscillator 4 to a frequency equal to the sum of the lower frequency of the tuning frequency band and the output of the highest rated energized precision frequency generator, is received by the counting stepper 9, the counting stepper continues its stepping operation and stops at the next highest frequency rated precision frequency generator line which has been energized by the frequency data input switching unit 1. The counting stepper then operates to close the circuit switch 11 in the line at which it has stopped, to connect the output of the next highest frequency rated energized precision frequency generator 3 with the mixer 6. The frequency output of the selected precision frequency generator is conducted to the mixer 6, where it is added to the frequency output of the band edge oscillator 7 plus the prior selected highest frequency generator output and the sum frequency is compared with the frequency of the oscillator 4, which is the frequency to which the continuous tuner 5 has tuned the oscillator 4 at such time. The zero beat indicator 8 then produces a pulse or beat which is conducted to the counting stepper 9 to continue the stepping operation and which indicates that the continuous tuner 5 has tuned the oscillator 4 to a frequency which is the sum of the lower frequency of the tuning frequency band, the output of the highest rated energized precision frequency generator and the output of the next highest rated energized precision frequency generator.

When the beat or pulse representing that the continuous tuner 5 has already tuned the oscillator 4 to a frequency equal to the sum of the lower frequency of the tuning frequency band, the output of the highest rated energized precision frequency generator and the output of the next highest rated energized precision frequency generator, is received by the counting stepper 9, the counting stepper continues its stepping operation and stops at the precision frequency generator line having an output rating equal to the next frequency to the next highest frequency rated precision frequency generator line which has been energized by the frequency data input switching unit 1. The stepping and continuous tuner control operations continue until all the energized precision frequency generator lines have been scanned by the counting stepper 9.

When the zero beat indicator 8 produces the beat or pulse which represents that the continuous tuner 5 has tuned the oscillator 4 to its ordered tuning frequency, the counting stepper 9 steps past the remaining deenergized precision frequency generator lines until it reaches the end of its travel. The counting stepper 9 discovers that the ordered tuning frequency has been reached when it finds that there are no longer any energized precision frequency generator lines awaiting its action. The counting stepper 9 then indicates to the continuous tuner 5 that the end of the operation has been reached by stopping the continuous tuner 5 precisely at the exact ordered tuning frequency.

The counting stepper 9 operates in accordance with standard stepping procedure. The step-switching operation is designed for faster operation than the continuous tuning operation, so that the continuous tuner will not get ahead of the step-switching operation.

The input switch 10 remains closed until the input switching unit 1 is turned off. When the input switch 10 is opened, either manually or by received intelligence from a remote source, the system is ready to receive another input intelligence signal representing a new tuning frequency for the master oscillator 4, even if such tuning frequency is in another preselected band. When the band switch 2 opens, at the end of the cycle of operation, the oscillator 4 is tuned at the frequency ordered by the input intelligence and all the circuits are so deenergized that they are ready for new information at any time that such new information is received; the old information at such time is completely wiped out, although the oscillator 4 remains tuned.

When the input switch 10 closes again, the continuous tuner 5 automatically drops back to its zero position, which is the lower end of its tuning range. The system will then operate to tune the oscillator 4 to the new ordered tuning frequency in a manner similar to that described.

The operation of the system of the present invention is most clearly presented by describing the tuning of the master oscillator by an arbitrarily selected ordered tuning frequency input intelligence signal. On the assumption that the system receives input intelligence ordering it to tune the master oscillator to 3168 kilocycles the operation is as follows.

Electrical digital intelligence, corresponding to the ordered tuning frequency of 3168 kilocycles is received in the input line 12. The input switch 10 is closed to close the input line 12 to the continuous tuner 5, to the frequency data input switching unit 1 and to the band switch 2.

Since the ordered tuning frequency is assumed to be 3168 kilocycles the preselected band for this frequency may be assumed to be 3000 kilocycles to 4000 kilocycles. Upon the closing of the circuit between the input line 12 and the continuous tuner 5, by the input switch 10, the continuous tuner 5 commences the operation of the system by tuning the master oscillator 4 to slightly below 3000 kilocycles. The continuous tuner 5 then automatically starts to tune across the 3000 to 4000 kilocycle band.

Upon the closing of the circuit between the input line 12 and the band switch 2, by the input switch 10, the band switch 2 places the oscillator 4 and the band edge oscillator 7 in the 3000 to 4000 kilocycle band, due to the energization of the band switch 2 by the input intelligence signal which indicates and identifies the ordered tuning frequency band as being from 3000 to 4000 kilocycles. The band switch 2 switches a 3000 kilocycle oscillator coil into the circuit of the master oscillator 4 and it switches a 3000 kilocycle crystal into the circuit of the band edge oscillator 7 in accordance with the ordered tuning frequency and the preselected band.

Upon the closing of the circuit between the input line 12 and the frequency data input switching unit 1, by the input switch 10, the frequency data input switching unit 1 operates to energize a sequence of precision frequency generators 3, ordered by the input intelligence, which produces a total frequency of 168 kilocycles.

The sum of the output frequencies of the precision frequency generators 3 must equal 1000 kilocycles, which is the 4000 kilocycle upper frequency of the band minus the 3000 kilocycle lower frequency of the band, to enable the system to work up from below 3000 kilocycles to any ordered tuning frequency in the band. The precision frequency generators 3 must therefore be selected and arranged to produce output frequencies of 1, 2, 4, 8, 16, 32, 64, 128, 256 and 512 kilocycles corresponding to ratings of the two to the zero power, two to the first power, two to the second power, two to the third power, two to the fourth power, two to the fifth power, two to the sixth power, two to the seventh power, two to the eighth power and two to the ninth power kilocycles, respectively. The sum total of their frequency outputs being 1023 kilocycles, the precision frequency generators 3 in the system are able to provide any ordered tuning frequency in any 1000 kilocycle band.

The input switching unit 1, in order to provide the 168 kilocycles necessary to bring the lower 3000 kilocycle band frequency up to the ordered 3168 kilocycle tuning frequency, energizes the 128 kilocycle rated precision frequency generator, the 32 kilocycle rated precision frequency generator and the 8 kilocycle rated precision frequency generator. This energization is facilely accomplished because the input intelligence is in binary form and because the output ratings of the precision frequency generators are binary valued. The precision frequency generators selected are respectively rated at two to the seventh power, two to the fifth power and two to the third power.

The band switch and input switching circuits of the system are adjusted to be more rapid in operation than the continuous tuner circuit so that the previously described band switching and input switching operations occur before the continuous tuner 5 has progressed up into the 3000 to 4000 kilocycle band.

The mixer 6 receives a frequency from the oscillator 4 which is below 3000 kilocycles. The band edge oscillator 7 feeds 3000 kilocycles to the mixer 6. The mixer 6 compares the output frequency of the oscillator 4 with the output frequency of the band edge oscillator 7. When the continuous tuner 5 has tuned the oscillator 4 up to 3000 kilocycles, the output frequency of the oscillator 4 compares with the 3000 kilocycle output frequency of the band edge oscillator 7 and the mixer 6 output operates the zero beat indicator to produce a beat or pulse which indicates to the counting stepper 9 that the oscillator 4 is tuned to 3000 kilocycles.

Upon receipt of the first output pulse or beat from the zero beat indicator 8 the counting stepper 9 commences its stepping operation by stepping past the deenergized 512 and 256 kilocycle lines and stops at the 128 kilocycle output precision frequency generator line. The counting stepper then operates to close the circuit switch 11 in the 128 kilocycle line to connect the 128 kilocycle precision frequency generator with the mixer 6. The mixer 6 adds the 128 kilocycles to the 3000 kilocycle output of the band pass oscillator 7 and compares the 3128 kilocycle sum with the output frequency of the oscillator 4. When the continuous tuner 5 tunes the oscillator 4 to 3128 kilocycles the mixer output operates the zero beat indicator 8 to produce a beat or pulse which indicates to the counting stepper 9 that the oscillator 4 is tuned to 3128 kilocycles.

When the pulse produced by the zero beat indicator, representing that the continuous tuner 5 has tuned the oscillator 4 to 3128 kilocycles, is received by the counting stepper 9, the counting stepper continues its stepping operation. The counting stepper steps past the deenergized 64 kilocycle line and stops at the 32 kilocycle output precision frequency generator line. The counting stepper then operates to close the circuit switch 11 in the 32 kilocycle line to connect the 32 kilocycle precision frequency generator with the mixer 6. The mixer 6 adds the 128 kilocycles and 32 kilocycles to the 3000 kilocycles output of the band pass oscillator 7 and compares the 3160 kilocycle sum with the output frequency of the oscillator 4. When the continuous tuner 5 tunes the oscillator 4 to 3160 kilocycles the mixer output operates the zero beat indicator 8 to produce a beat or pulse which indicates to the counting stepper that the oscillator 4 is tuned to 3160 kilocycles.

When the pulse produced by the zero beat indicator, representing that the continuous tuner 5 has tuned the oscillator 4 to 3160 kilocycles, is received by the counting stepper 9, the counting stepper continues its stepping operation. The counting stepper steps past the deenergized 16 kilocycle line and stops at the 8 kilocycle output precision frequency generator line. The counting stepper then operates to close the circuit switch 11 in the 8 kilocycle line to connect the 8 kilocycle precision frequency generator with the mixer 6. The mixer 6 adds the 128 kilocycles, the 32 kilocycles and the 8 kilocycles to the 3000 kilocycle output of the band pass oscillator 7 and compares the 3168 kilocycle sum with the output frequency of the oscillator 4. When the continuous tuner 5 tunes the oscillator 4 to 3168 kilocycles the mixer output operates the zero beat indicator 8 to produce a beat or pulse which indicates to the counting stepper that the oscillator 4 is tuned to 3168 kilocycles.

When the pulse produced by the zero beat indicator, representing that the continuous tuner 5 has tuned the oscillator 4 to 3168 kilocycles, is received by the counting stepper 9, the counting stepper continues its stepping operation. The counting stepper steps past the deenergized 4, 2 and 1 kilocycle lines until it reaches the end of the travel. The counting stepper 9 discovers that the ordered tuning frequency of 3168 kilocycles had been reached when it finds that there are no longer any energized precision frequency generator lines awaiting its action. The counting stepper 9 then indicates to the continuous tuner 5 that the end of the operation has been reached by stopping the continuous tuner 5 precisely at the exact ordered tuning frequency of 3168 kilocycles.

When the oscillator 4 is tuned at 3168 kilocycles the input switch 10 opens and the system is ready to receive new ordered tuning frequency intelligence.

The frequency data input switching unit 1 may be replaced by a binary keyboard, which is manually operated by an operator who knows what the ordered tuning frequency of the oscillator 4 is and who depresses the proper keys to energize those precision frequency generators which together produce a frequency equal to the difference between the ordered tuning frequency and the lower frequency of the preselected band of the ordered tuning frequency. The operator also depresses a key to initiate the operation of the band switch 2 to locate the band pass oscillator 7 and the master oscillator 4 in the ordered tuning frequency's preselected band.

The binary system, described as a preferred embodiment of the present invention, is not essential for the proper operation of the present invention. If other than the binary system is utilized, the input intelligence, containing the ordered tuning frequency data, is fed to a digital to binary translator just before or just after it reaches the input switch 10. The digital to binary translator is known in the art.

The useful output of the master oscillator 4 shown in the figure may be a receiver or equipment other than a receiver. Among other applications, oscillator 4 may be utilized as a signal generator.

Obviously many modifications and variations of the present invention are possible in the light of the above teachings. It is therefore to be understood that within the scope of the appended claim the invention may be practiced otherwise than as specifically described.

I claim:

In combination; a tunable oscillator for generating any frequency over a particular range of frequency, said tunable oscillator including first means for dividing the range of frequency that may be generated by said tunable oscillator into adjacent frequency bands, and second means in said tunable oscillator that is continuously adjustable over a range, said first means being variously connectible to said second means to afford the selected one of said frequency bands and said second means being continuously adjustable for tuning said tunable oscillator from end-to-end of the frequency band selected by the particular connection of said first means to said second means; a motor means connected to said second means for driving said second means through its continuously adjustable range; a first precision oscillator means including a plurality of frequency determining means equal in number to the number of said frequency bands and that are separately connectible in said precision oscillator to enable said precision oscillator to generate one frequency for each of the frequency bands respectively of said tunable oscillator such that each frequency generated by said first precision oscillator means is slightly higher than the lowest frequency of the corresponding band of said tunable oscillator; a band switch connected to said first means of said tunable oscillator and said plurality of frequency determining means of said first precision oscillator means whereby each frequency band of said tunable oscillator and the corresponding frequency of said first precision oscillator means are activated concurrently; a plurality of distinct precision oscillator means for generating a corresponding plurality of particular frequencies of binary relationship whereby the sum of all the binary-related frequencies exceeds the width of each of the frequency bands of said first tunable oscillator; a manual independently operable on-off switch connected to each of said plurality of precision oscillator means for activating any one or combination of said plurality of precision oscillator means concurrently; a mixer; said tunable oscillator and said first precision oscillator means being connected to said mixer; a plurality of separate open-closed switch means equal in number to said plurality of distinct precision oscillator means connected between said mixer and each of said plurality of precision oscillator means respectively; stepping means that progresses one step in response to each current impulse thereto, said stepping means being mechanically coupled to said last-mentioned switch means for closing said plurality of switch means in sequence, said stepping means having one step position in which said last-mentioned switch means are all open and another step position in which said last-mentioned switch means are all closed and in stepping from its one step position to its other step position in response to impulses, it passes through all intermediate step positions and successive ones of said last-mentioned switch means are actuated from open to closed condition, said last-mentioned switch being coupled to said stepping means in a sequence such that the one of said last-mentioned switch means connected to the one of said plurality of precision oscillator means which provides the highest of the binary frequencies is connected to said stepping means in position to be closed first by said stepping means and the one of said last-mentioned switch means connected to the one of said plurality of precision oscillators which provides the lowest of the binary frequencies is connected to said stepping means in position to be closed last by said stepping means, for coupling into said mixer from said plurality of precision oscillator means the highest frequency first down to the lowest frequency last; a zero beat means connected between said mixer and said stepping means for providing a current impulse to said stepping means each time the frequency of said tunable oscillator is raised to where it equals the sum of the frequencies generated by said first precision oscillator means and said latter precision oscillator means that are switch-connected to said mixer; and manually operable switch means connected to said motor for activating said motor.

References Cited in the file of this patent

UNITED STATES PATENTS

| | | |
|---|---|---|
| 2,231,634 | Mouk | Feb. 11, 1941 |
| 2,580,453 | Murray et al. | Jan. 1, 1952 |